United States Patent
Driller et al.

[11] Patent Number: 5,977,786
[45] Date of Patent: Nov. 2, 1999

[54] ADAPTER INCLUDING SOLID BODY

[75] Inventors: Hubert Driller; Paul Mang, both of Schmitten, Germany

[73] Assignee: Mania GmbH & Co., Weilrod, Germany

[21] Appl. No.: 08/591,554

[22] PCT Filed: Jul. 5, 1994

[86] PCT No.: PCT/EP94/02198

§ 371 Date: Jan. 11, 1996

§ 102(e) Date: Jan. 11, 1996

[87] PCT Pub. No.: WO95/02829

PCT Pub. Date: Jan. 26, 1995

[30] Foreign Application Priority Data

Jul. 12, 1993 [DE] Germany ............................ 48 23 276

[51] Int. Cl.⁶ ............................................... G01R 31/02
[52] U.S. Cl. ......................................... 324/761; 324/755
[58] Field of Search .................................. 324/761, 760, 324/754, 72.5; 439/482

[56] References Cited

U.S. PATENT DOCUMENTS

| | | | |
|---|---|---|---|
| 4,061,969 | 12/1977 | Dean | 324/754 |
| 4,322,682 | 3/1982 | Schadwill | 324/761 |
| 4,352,061 | 9/1982 | Matrone | 324/754 |
| 4,774,459 | 9/1988 | Maelzer et al. | 324/761 |
| 4,841,241 | 6/1989 | Hilz et al. | 324/761 |
| 4,896,107 | 1/1990 | Maelzer et al. | 324/761 |
| 4,899,104 | 2/1990 | Maelzer et al. | 324/761 |
| 5,043,656 | 8/1991 | Clark | 324/754 |
| 5,159,265 | 10/1992 | Alfonso et al. | 324/761 |
| 5,175,325 | 12/1992 | Murphy | 324/761 |
| 5,175,493 | 12/1992 | Langgard | 324/761 |
| 5,351,002 | 9/1994 | Wollert et al. | 324/754 |
| 5,493,230 | 2/1996 | Swart et al. | 324/754 |

FOREIGN PATENT DOCUMENTS

| | | |
|---|---|---|
| 0 150 327 | 8/1985 | European Pat. Off. . |
| 0 451 690 | 10/1991 | European Pat. Off. . |
| 33 16 103 | 11/1984 | Germany . |
| 85 01 493 | 9/1986 | Germany . |
| 36 30 548 | 3/1988 | Germany . |
| 36 38 372 | 5/1988 | Germany . |
| 38 06 793 | 9/1989 | Germany . |
| 90 14 236 | 2/1991 | Germany . |
| 813 330 | 3/1981 | U.S.S.R. . |
| 1 206 711 | 1/1986 | U.S.S.R. . |
| 88/03651 | 5/1988 | WIPO . |

*Primary Examiner*—Vinh P. Nguyen
*Attorney, Agent, or Firm*—Wenderoth, Lind & Ponack, L.L.P.

[57] ABSTRACT

An adapter for adapting a uniform contact grid of an electrical testing device for testing printed circuit boards to an irregular contact configuration of connection points on a printed circuit board to be tested includes upper and lower pin retention plates respectively defining a cover surface to lie against a surface of the printed circuit board to be tested and a base surface to lie on a contact field of the testing device. Substantially an entire space between the upper and lower pin retention plates are filled with a substantially incompressible solid body of low density and high surface pressure resistance. Needle-like test pins are positioned in test pin channels extending through the solid body.

38 Claims, 1 Drawing Sheet

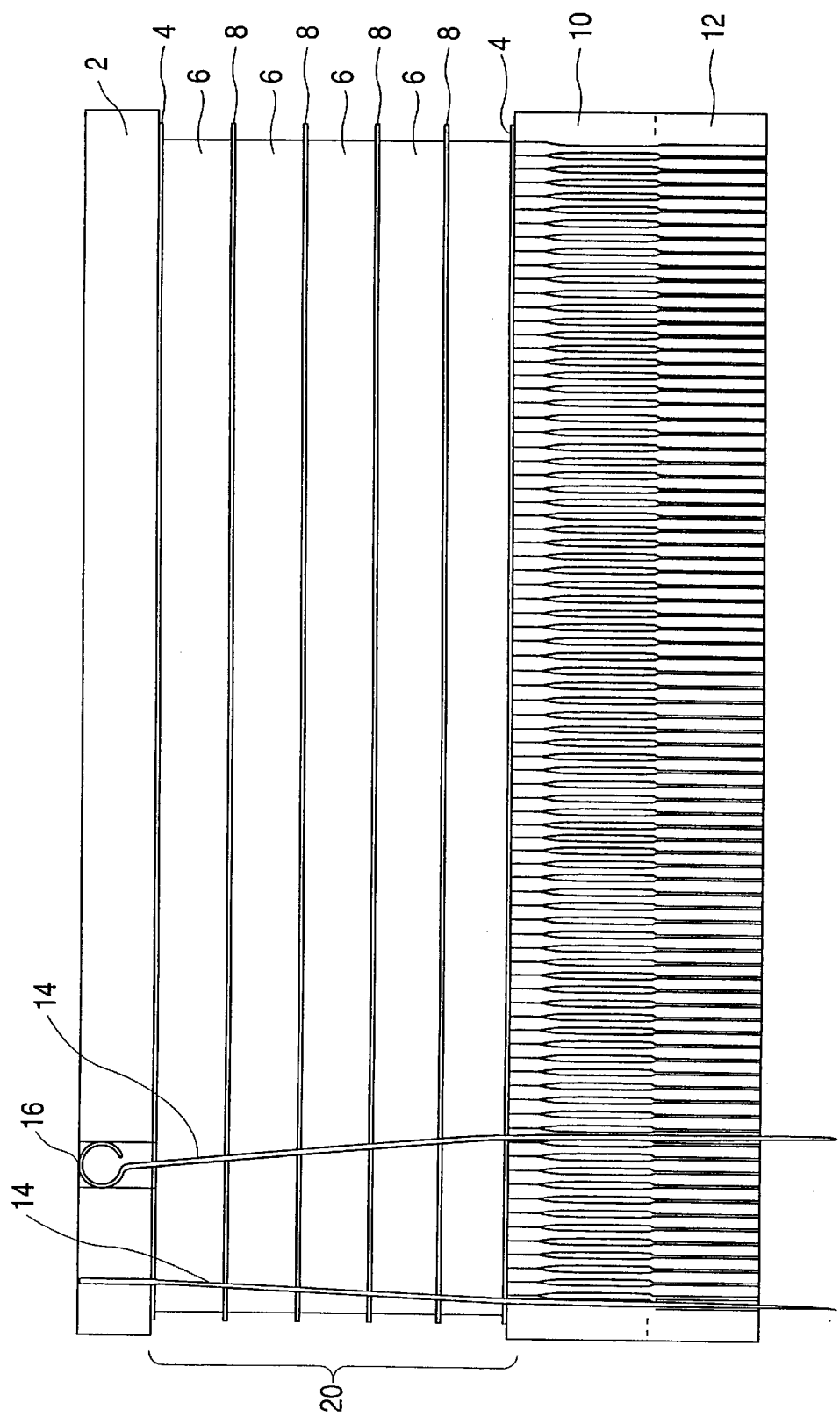

ADAPTER INCLUDING SOLID BODY

BACKGROUND OF THE INVENTION

A present invention relates to an adapter for adapting a uniform contact grid of an electronic testing device for testing PCBs (printed circuit boards) to an irregular contact configuration of contact points on a PCB to be tested.

A "universal adapter" in accordance with EP-B1 26 824 has a base plate lying on a base grid of a testing device, which is provided with channels or bores which pass through it corresponding to a uniform contact grid of the testing device. At a distance above the base grid concerned, that is on a side of the base plate facing away from the base grid of the testing-device, there is an arrangement of two spaced-apart adapter plates, disposed or positioned by fixed spacing means. These adapter plates are identically provided with bores which are distributed corresponding to variably disposed connection points of a PCB to be tested. Needle-like test pins, which are resilient longitudinally, are inserted into these bores in the adapter plates. These test pins are able to pivot resiliently outwards, at least in their lower section, transverse to a lengthwise direction of the test pins, thus to offset any defects of alignment between the testpiece-specific bores and the grid of the testing device connected channels. With such an adapter made up of several plates, a manufacturer of PCBs must prepare at least the testpiece-specific adapter plates for each test series, in order to be able to assemble an adapter at all. Thus, rationalization for production of adapters is, to this extent, not possible.

As many thousands of connection points can be provided in complex PCBs, and a resilient test pin is needed for each connection point, costs for such an adapter rise markedly with increase in the number of contact points, since test pins that are resilient in the longitudinal direction require production costs that are not inconsiderable. In addition, such test pins have a minimum practical diameter that represents a natural limit for the possible density of the test pins.

In order to be able to use test pins that are rigid in the longitudinal direction and that thus are easy to manufacture to be particularly thin, an "active base grid" has been produced in which contacts of the base grid of a PCB testing device are resiliently supported essentially in the direction of the longitudinal axis of the test pins. This active base grid is applied onto the rigid, hard-wired base grid of the PCB testing device and serves, when rigid test pins are used, to provide sufficiently high contact pressure which is as uniform as possible at all test points contacted by the rigid test pins.

EP-A1-0 215 146 shows an adapter ("adapter 85") having an upper testpiece-specific bored adapter plate that lies on a PCB to be tested and rigid contourless test pins that pass through an additional elastic mat disposed at a distance below the PCB. The elastic mat is unbored and, because of the elasticity of material of the mat, prevents falling out of the test pins during handling with the adapter concerned, independently of the actual testing device. In this way, upon subsequent testing of identical PCBs, the labor costs of fitting the adapter with test pins, which costs are not inconsiderable, can be saved. Such adapter can be stored again until it is again used. Such adapter has the advantage that rigid, completely contourless test pins, which can be manufactured very cheaply, can be used, although fitting of the adapter becomes more complicated in that the test pins cannot simply "drop into" the adapter, but rather have to be pushed through the unbored elastic mat with a certain force. This adapter furthermore has an inner adapter plate, a grid of which, however, corresponds neither to the grid of the outer adapter plate or to the grid of the base plate. This therefore means that it is necessary to manufacture at least one further adapter plate with a bore pattern which differs from that of a first-mentioned adapter-plate, in addition to the testpiece-specific bored adapter plate.

There are further adapter-designs for which an entire series of bored adapter plates are disposed between a testpiece-specific bored adapter plate and a grid-hole plate of an adapter lying on a contact point grid of a testing device. Bore patterns of the series of adapter plates produce a gradual transition from the testpiece-specific bored adapter plate to the grid-hole plate and therefore vary in each case and thus require higher production costs and costs for materials when producing such adapters. In addition, fitting such adapters with test pins is particularly difficult.

The adapters described above were designed for one side testing of PCBs. Increasingly however PCBs that have connection points on both sides are being used, and they must be tested on both sides. Two successive one-side tests can be used, although breaks in current due to so-called "risers" then will not be detected, such risers moreover being particularly sensitive to breaks in current. PCB testing devices therefore have been developed which are able to effect simultaneous testing on both sides of PCBs. This then also leads to a need for adapters for such testing devices. Unfortunately, many adapters can be used for simultaneous double-sided testing only in exceptional cases, since if connection points on both sides of a PCB to be tested are unevenly distributed, with the sometimes several thousand test pins there will result substantial deformation or displacement of the test-piece. This can lead to additional (new) defects in the connection paths, or even to breakage of the PCB, particularly with ceramic boards. With one-sided testing of PCBs, uneven distribution or localized concentration of test-pins cannot lead to such a disadvantageous effect, as abutment on the opposite side of a testpiece can be by a stable plate of the actual testing device, and such plate takes up all irregular inputs of force into the PCB, substantially without deformation, and thereby supports the PCB to be tested in a largely undeformed state. With simultaneous, double-sided testing of PCBs, this however is not possible, since rigid abutment either is not present on a second side of a testpiece, or is the testpiece-specific bored adapter-plate of the other adapter, whereby this adapter plate cannot be made to be rigid at will, particularly as it is frequently produced from acrylic glass or similar material, in order to facilitate a manual fitting of the adapter.

The problem of possibly missing abutment and therefore of localized application of excessive force to a PCB during simultaneous, double-sided testing thereof is overcome by an adapter per EP-0 315 707 ("adapter 87") by introducing additional support means into such adapter at particularly loaded points, as separately sprung support-pins for example. With further increasing densities of connection surfaces of PCBs to be tested, occurring as part of the miniaturization of PCBs or wiring carriers, it is becoming more and more difficult to provide the space necessary for these support pins between the actual test pins. In addition, production and insertion of the support pins into an adapter results in substantial additional production costs.

There are adapter arrangements including resilient test pins (U.S. Pat. No. 3,654,585) or flexible elastic bits of wire (EP-184 619) disposed, with comparable function, parallel to each other in an essentially rigid or compressible solid body, that is, a "vertical PCB". However, the actual translation or adapting between irregularly or unevenly disposed testpiece-oriented contact points and the contacts of the testing device in a strictly grid-shaped arrangement is brought about by an additional "transition plate" which in accordance with standard PCB technology is provided with contact surfaces that are offset from each other, on both board surfaces, and with "risers" for connection of the contact surfaces. These adapter arrangements therefore require increased production costs simply due to the requirement for the transition or adapter plate.

SUMMARY OF THE INVENTION

The above disadvantages of the prior art are avoided by an adapter in accordance with the present invention. The necessity for preparatory boring of several adapter plates with different bore patterns is completely avoided. Each PCB or wire carrier to be tested is supported over its entire surface. Thus, localized massing of test pins on one side of a testpiece, without corresponding massing of test-pins, or without additional support-pins on the opposite side of a testpiece, does not lead to problems of too much input of force to the testpiece.

BRIEF DESCRIPTION OF THE DRAWING

The enclosed single FIGURE is a schematic view of a present invention.

DETAILED DESCRIPTION OF THE INVENTION

The adapter includes a testpiece-specific, bored, upper adapter plate 2 and a lower grid-hole plate 10 forming pin retention plates. A zone or space between plates 2 and 10 is completely filled, in accordance with a present invention, by a solid body 20 of suitable material which can be compressed as little as possible and which has a high surface pressure resistance with low density. In the illustrated embodiment, such is a composite material which is made up of different layers including a phenol paper layer 4 lying on a base surface of upper plate 2, onto which an underlying relatively thick layer 6 of a porous foam material, such as polystyrene, or possibly balsa wood or similar material adjoins. Underneath layer 6 is a relatively thin layer 8 of a fibrous non-woven material which has a stabilizing effect in the radial direction on a test-pin 14 passing through the composite material. Following this, further downwardly, there is again a layer 6 of porous foam material and again a layer 8 of stabilizing fibrous non-woven material. This sequence of layer materials can be repeated several times as shown by the drawing. The last lower layer 6 of porous foam material is closed off downwardly by a phenol paper layer 4 which lies on conventional grid-hole plate 10, individual bores of which, as can be seen in the drawing, have a somewhat larger diameter on top than below, in order to compensate for a possible slight deviation of a test pin from a desired test pin channel through solid body 20. Below grid-hole plate 10 is a further compressible grid-hole mat 12 which provides for easy, sprung resilience of the adapter in a vertical direction, e.g. 3–6 mm of resilient movement in a typical case. In this manner it is possible to obtain sufficient contact pressure for all occurring contact height tolerances or variations of test-pin length. Below compressible grid-hole mat 12 is a known grid-linked contact-point connection field of an actual electronic PCB testing device, which is not dealt with in detail as it is conventional and in the art. Plate 2 defines a cover surface to be abutted or contacted by a surface of a PCB to be tested. Plate 10 or mat 12 defines a base surface to abut or contact a contact field of the testing device.

When completely flat, contourless test pins 14 are used in a solid adapter in accordance with a present invention, falling-out of such pins from the solid-material adapter can be prevented if, when each test pin is plunged into a respective test pin channel, it is ensured that, in each case, slight bending of the test pin is caused as can be seen from both test pins shown in the drawing. Such slight bending can be achieved by suitable control of insertion of the test pins or by a suitable design of test pin channels in connection with grid-hole plate 10 and grid-hole mat 12.

In the drawing, for reasons of simplicity, only two test pins (with different respective heads) are shown, although in practice such adapters can normally use several dozens up to several thousands of test pins per adapter. As shown, depending on use, contourless test pins mixed with test pins with a suitable head 16 can be used. Such head 16 can be formed simply by bending a contourless, flat test pin. The test pin channel which passes through solid body 20 of the adapter and which receives test pin 14 is preferably, although not exclusively, produced in that either a test pin 14 itself or a somewhat thicker (e.g. 50%) needle is stuck into the solid body 20 by a known test pin setting machine. Such test pin setting machines are known in the art and have for a long period of time been used for fitting plate adapters as discussed initially above. These test pin setting machines are able to plunge in a test pin, or if this is too thin a somewhat thicker needle, at an exactly predetermined position and with an exactly predetermined inclined orientation into solid body 20. That is, a test-pin channel can preferably be produced simultaneously when a test pin is inserted into the adapter. For this purpose, the material of the solid body being used must firstly be soft enough for such a test pin to be plunged into it without problems and secondly such material must have a relatively high surface-pressure resistance in order to continuously support the testpiece-specific, bored upper adapter plate 2 on its entire surface. A material favored for these purposes is, for example, Styrofoam, or balsa wood or similar materials, that is a substantially incompressible material of low density although with a relatively high surface-pressure resistance. Materials made of hard synthetic foams or materials based on glass fibers also can be used.

It is quite conceivable that necessary test pin channels, passing through solid body 20 will be produced by suitable techniques other than plunging-in with aid of a needle. Such bores or channels can, for example, also be produced by laser jets, ultrasonic boring, mechanical boring, burning, water jets or similar techniques, even if plunging-in into suitable materials with aid of a test pin setting machine is currently preferred.

A point of application of a needle to be inserted into solid body 20 can be defined by a hole-plate located thereon which is either a testpiece-specific, bored plate or a grid-hole plate, depending on from which side of solid body 20 insertion occurs. In the illustrated embodiment, it is assumed that insertion of a needle and/or of test pin 14 has occurred from the test-piece side, whereby the conical bores in grid-hole plate 10 serve to compensate for slight deviations from desired test pin channels at a lower end, and to exactly guide a test pin onto a given grid-linked contact-point of a testing machine, which, in the case of compressible grid mat 12, is disposed on a lower end of the bore, inside such bore.

Test pins 14, as shown in the drawing, are of unitary one-piece construction. The test-pins used can be contourless, so-called "music-wire" test pins which have diameters as small as 0.1 mm or 0.004 inches. Such a thin, headless test pin can, in some cases of application of an adapter, be too thin for the connection point on the PCB, often implemented as a bore. That is, there is a risk that no usable contact between the contourless test pin and the contact point of the testpiece is produced. Thus, a sufficiently large head 16 preferably can be produced on such contourless test pin by bending an upper end thereof contacting the test piece round or back in a suitable manner, for example in a circle, to form a shape something like a bishop's staff or the like. In this way, it is possible, in a particularly advantageous manner with the use of particularly thin, contourless test pins which are used with high contact densities, to contact relatively large points of contact (approximately formed as bores/risers) in a test piece without there being large production costs for a test pin head. Depending on the particular test piece, test pins with and without such heads can be employed alone or mixed in an adapter.

We claim:

1. An adapter for adapting a uniform contact grid of an electrical testing device for testing printed circuit boards to an irregular contact configuration of connection points on a printed circuit board to be tested, said adapter comprising:

a cover surface member defining a cover surface on which is to lie a surface of the printed circuit board to be tested;

a base surface member spaced from said cover surface member and defining a base surface to lie on a contact field of the testing device;

substantially an entire space between said cover surface member and said base surface member being filled with a substantially incompressible solid body of low density and high surface pressure resistance, said solid body having therein test pin channels;

needle-like test pins in said test pin channels and having first ends extending through bores in said cover surface member and second ends extending through bores in said base surface member, each said test pin being of a unitary one-piece construction; and said test pin channels having a configuration resulting from said test pins being plunged into said solid body.

2. An adapter as claimed in claim 1, wherein said cover surface member and said base surface member comprise upper and lower test pin retention plates, respectively.

3. An adapter as claimed in claim 2, wherein bores in said upper test pin retention plate are located at testpiece-specific positions.

4. An adapter as claimed in claim 2, wherein said bores in said lower test pin retention plate are located in a grid.

5. An adapter as claimed in claim 4, wherein said grid is determined to correspond to a grid of the printed circuit board to be tested.

6. An adapter as claimed in claim 4, wherein said grid is determined to be denser than a grid of the printed circuit board to be tested.

7. An adapter as claimed in claim 1, wherein said solid body comprises a unitary one-piece member formed of a uniform material.

8. An adapter as claimed in claim 7, wherein said uniform material comprises balsa wood.

9. An adapter as claimed in claim 7, wherein said uniform material comprises Styrofoam.

10. An adapter as claimed in claim 7, wherein said uniform material comprises a synthetic hard foam material.

11. An adapter as claimed in claim 1, wherein said solid body is formed of a multi-layered composite material.

12. An adapter as claimed in claim 11, wherein said composite material comprises plural layers of a substantially incompressible solid material of low density and high surface pressure resistance with interposed layers of a fibrous non-woven material.

13. An adapter as claimed in claim 1, wherein each said bore in said base surface member has a size that increases in a direction away from said base surface.

14. An adapter as claimed in claim 1, wherein each said bore in said base surface member is conical.

15. An adapter as claimed in claim 1, wherein at least some of said test pins comprise rigid non-resilient pins.

16. An adapter as claimed in claim 1, wherein at least some of said test pins comprise contourless pins.

17. An adapter as claimed in claim 1, wherein said first ends of at least some of said test pins are shaped to have a hook or circular configuration.

18. An adapter as claimed in claim 1, wherein said test pin channels have diameters corresponding to diameters of respective said test pins.

19. An adapter as claimed in claim 1, wherein said solid body has a width and a length dimensioned to support the entire circuit board to be tested.

20. An adapter for adapting a uniform contact grid of an electrical testing device for testing printed circuit boards to an irregular contact configuration of connection points on a printed circuit board to be tested, said adapter comprising:

a cover surface member defining a cover surface on which is to lie a surface of the printed circuit board to be tested;

a base surface member spaced from said cover surface member and defining a base surface to lie on a contact field of the testing device;

substantially an entire space between said cover surface member and said base surface member being filled with a substantially incompressible solid body of low density and high surface pressure resistance, said solid body having therein test pin channels;

needle-like test pins in said test pin channels and having first ends extending through bores in said cover surface member and second ends extending through bores in said base surface member, each said test pin being of a unitary one-piece construction; and said test pin channels having a configuration resulting from plunging into said solid bodies of needles having a diameter greater than a diameter of said test pins.

21. An adapter as claimed in claim 20, wherein said cover surface member and said base surface member comprise upper and lower test pin retention plates, respectively.

22. An adapter as claimed in claim 21, wherein bores in said upper test pin retention plate are located at testpiece-specific positions.

23. An adapter as claimed in claim 21, wherein said bores in said lower test pin retention plate are located in a grid.

24. An adapter as claimed in claim 23, wherein said grid is determined to correspond to a grid of the printed circuit board to be tested.

25. An adapter as claimed in claim 23, wherein said grid is determined to be denser than a grid of the printed circuit board to be tested.

26. An adapter as claimed in claim 20, wherein said solid body comprises a unitary one-piece member formed of a uniform material.

27. An adapter as claimed in claim 26, wherein said uniform material comprises balsa wood.

28. An adapter as claimed in claim 26, wherein said uniform material comprises Styrofoam.

29. An adapter as claimed in claim 26, wherein said uniform material comprises a synthetic hard foam material.

30. An adapter as claimed in claim 20, wherein said solid body is formed of a multi-layered composite material.

31. An adapter as claimed in claim 30, wherein said composite material comprises plural layers of a substantially incompressible solid material of low density and high surface pressure resistance with interposed layers of a fibrous non-woven material.

32. An adapter as claimed in claim 20, wherein each said bore in said base surface member has a size that increases in a direction away from said base surface.

33. An adapter as claimed in claim 20, wherein each said bore in said base surface member is conical.

34. An adapter as claimed in claim 20, wherein at least some of said test pins comprise rigid non-resilient pins.

35. An adapter as claimed in claim 20, wherein at least some of said test pins comprise contourless pins.

36. An adapter as claimed in claim 20, wherein said first ends of at least some of said test pins are shaped to have a hook or circular configuration.

37. An adapter as claimed in claim 20, wherein said test pin channels have a diameter which is greater than a diameter of said test pins by up to 50%.

38. An adapter as claimed in claim 20, wherein said solid body has a width and a length dimensioned to support the entire circuit board to be tested.

* * * * *